United States Patent [19]
Hasegawa et al.

[11] Patent Number: 6,097,790
[45] Date of Patent: Aug. 1, 2000

[54] PRESSURE PARTITION FOR X-RAY EXPOSURE APPARATUS

[75] Inventors: Takayuki Hasegawa; Eiji Sakamoto, both of Utsunomiya, Japan

[73] Assignee: Canon Kabushiki Kaisha, Tokyo, Japan

[21] Appl. No.: 09/030,080

[22] Filed: Feb. 25, 1998

[30] Foreign Application Priority Data

Feb. 26, 1997 [JP] Japan ................................. 9-058422

[51] Int. Cl.⁷ ........................................... G21K 1/00
[52] U.S. Cl. .................................... 378/161; 378/34
[58] Field of Search .............................. 378/161, 140, 378/34

[56] References Cited

U.S. PATENT DOCUMENTS

| | | | |
|---|---|---|---|
| 5,093,579 | 3/1992 | Amemiya et al. | 250/453.1 |
| 5,138,643 | 8/1992 | Sakamoto et al. | 378/34 |
| 5,159,621 | 10/1992 | Watanabe et al. | 378/161 |
| 5,231,291 | 7/1993 | Amemiya et al. | 250/443.1 |
| 5,627,872 | 5/1997 | Verga | 378/161 |

FOREIGN PATENT DOCUMENTS 9-68599  3/1997  Japan .

*Primary Examiner*—David P. Porta
*Attorney, Agent, or Firm*—Fitzpatrick, Cella, Harper & Scinto

[57] ABSTRACT

A pressure partition includes a thin film for dividing a predetermined space into two spatial zones and a supporting device for supporting the film at an outside peripheral portion thereof. The supporting device has a curved surface for producing curvature in the outside peripheral portion of the film. The curved surface is disposed at one of the two spatial zones having a lower pressure as compared with the other, and the curved surface has a convex shape with respect to a plane intersecting the film.

14 Claims, 5 Drawing Sheets

$P_2 - P_1 = \Delta P$

PRESSURE PARTITION FOR X-RAY EXPOSURE APPARATUS

FIELD OF THE INVENTION AND RELATED ART

This invention relates to a pressure partition for use as an X-ray window in an exposure chamber of an X-ray exposure apparatus, for example, for mutually isolating two ambiences of different pressures, and also to an X-ray exposure apparatus using the same.

In X-ray exposure apparatuses to be used with exposure light comprising synchrotron radiation such as synchrotron X-rays from a charged particle accumulation ring, for example, a high vacuum should be maintained in a beam duct extending from a light source to an exposure chamber in order to reduce attenuation of the X-rays by the atmosphere. To this end, an X-ray extracting window (pressure partition) is provided to mutually isolate two ambiences, that is, the high vacuum beam duct and the exposure chamber of an ambience approximately the same as the atmosphere or of a low vacuum or reduced pressure ambience of helium gas, for example.

Such an X-ray window comprises a thin film of a material of a high X-ray transmissivity, such as beryllium, silicon nitride, silicon carbide, and diamond, for example. The thin film should have a high X-ray transmissivity in order to avoid loss of X-ray energy, and also it should have mechanical strength sufficient to bear the pressure difference between the beam duct and the exposure chamber.

FIG. 6 shows a known type X-ray window $E_0$ which comprises a beryllium film 111 of a few microns or several tens of microns in thickness and a flange 112 for supporting the outside periphery of the film. The outside periphery of the beryllium film 111 is fixed to the flange 112 by means of a bonding ring 113. The flange 112 is fixedly connected to a flange 102a of a beam duct 102 by means of an O-ring 114 and bolts 115.

As described, the beryllium film 111 should have mechanical strength sufficient to bear a pressure difference $\Delta P$ between a pressure $P_1$ of the beam duct 102, being kept in a high vacuum, and a pressure $P_2$ of the exposure chamber, being kept in a reduced pressure of helium gas. Additionally, it should have a high X-ray transmissivity. Thus, it is desirable to reduce the thickness of the beryllium film 111 as much as possible, within the limit of the required mechanical strength.

Generally, when a pressure difference p is applied to a very thin film of a material having a Young's modulus E and a large deflection or flexure is produced, and if the thickness of the film is h, the tension stress $\sigma(r=0)$ at the center of the film of a circular shape with a radius a and the tension stress $\sigma(r=a)$ at the outside peripheral edge of that film can be calculated in accordance with the following equations:

$$\sigma(r=0) = 0.423 \cdot (E \cdot p^2 \cdot a^2 / h^2)^{1/3} \qquad (1)$$

$$\sigma(r=a) = 0.328 \cdot (E \cdot p^2 \cdot a^2 / h^2)^{1/3} \qquad (2)$$

Thus, usually, the thickness of the beryllium film 111 is determined so that the tension stress $\sigma_1$ at the center of the film 111 as the flexure is produced in the film 111 by the applied pressure difference $\Delta P$, does not exceed the breaking stress.

More specifically, if the breaking stress of the beryllium film 111 is $\sigma_0$ and the tolerance for the pressure difference $\Delta P$ related to the beryllium film 111, that is, the design pressure, is $P_0$, then the necessary thickness T can be expressed from equation (1) as follows:

$$T > 0.275 \cdot P_0 \cdot a / \sigma_0 \cdot (E/\sigma_0)^{1/2} \qquad (3)$$

In practical design of an X-ray window, a safety factor A is taken into account and the thickness $T_0$ of the beryllium film 111 is determined in accordance with the following equation:

$$T_0 = A \cdot 0.275 \cdot P_0 \cdot a / \sigma_0 \cdot (E/\sigma_0)^{1/2} \qquad (4)$$

Actually, however, even if the thickness of a beryllium film is determined in accordance with equation (4), there is a possibility that the beryllium film is broken by a pressure difference lower than the design pressure $P_0$. It is, therefore, necessary to design the thickness with a larger safety factor A. Breakage of a beryllium film with a pressure difference lower than the design pressure $P_0$ may appear at its contact portion with the flange which fixes the outside periphery of the film. Such breakage cannot be prevented simply by rounding the corner of the flange.

If the safety factor A is made large, the beryllium film should then have a larger thickness and, thus, the X-ray transmissivity cannot be large. This causes a large loss of energy and a reduction of productivity of semiconductor products.

SUMMARY OF THE INVENTION

It is accordingly an object of the present invention to provide a pressure partition which enables a design with sufficient mechanical strength and with a very small thickness.

It is another object of the present invention to provide an X-ray exposure apparatus or a device manufacturing method which uses a pressure partition as described above.

In accordance with an aspect of the present invention, there is provided a pressure partition, comprising: a thin film for dividing a predetermined space into two spatial zones; and supporting means for supporting said film at an outside peripheral portion thereof, said supporting means having a curvature support for producing curvature in the outside peripheral portion of said film, along a predetermined curvature plane.

The curvature support may have a curvature radius which is larger than the value of the curvature radius to be defined when a tension stress of to be produced at the outside peripheral portion of said film by flexure thereof along said curvature support becomes equal to a difference between tension stresses $\sigma_1$ and $\sigma_2$, to be produced at the center portion and the outside peripheral portion of the film, respectively, by deflection of the film due to a pressure difference between the two spatial zones.

Said curvature support of said supporting means may have a curvature radius which increases toward the center of said film.

The thickness of the thin film for bisecting the predetermined space may be designed so that, as deflection is produced due to a difference of pressures applied to both faces of the film, it bears the tension stress to be produced at the center of the film. The tension stress produced at the center of the film by flexure of the film due to the pressure difference is larger than the tension stress at the outside peripheral portion of the film. However, since a tension stress produced by bending or flexure of the film, caused by contact with the supporting means, is additionally applied to the outside peripheral portion of the film, there is a possibility that a tension stress larger than that at the center is applied to this portion.

In consideration of this, a curvature support for supporting the outside peripheral portion of the film along a curved surface having a large curvature radius may be provided, to reduce the tension stress to be produced by flexure due to contact with the supporting means.

If the tension stress to be produced at the outside peripheral portion of the film does not exceed the tension stress at the center thereof and if the largest value of tension stress of the whole film corresponds to the tension stress at the center thereof, it is riot necessary to use an unnecessarily large safety factor in the film thickness design as has been described above. This enables a further reduction of the film thickness and enlargement of the X-ray transmissivity.

Where such a pressure partition is used as an X-ray window, the efficiency of X-ray utilization can be improved and the productivity of an X-ray exposure apparatus can be enlarged.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will be described with reference to the drawings.

Figure 1:
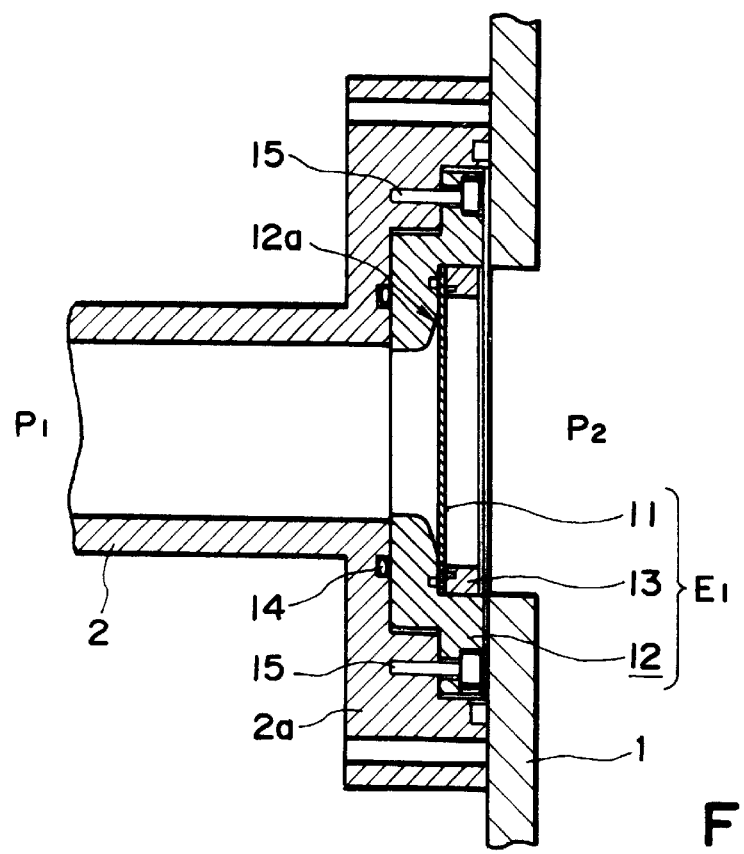
FIG. 1 is a schematic and sectional view of an X-ray window according to an embodiment of the present invention.

FIG. 1 shows an X-ray extraction window $E_1$ comprising a partition wall according to an embodiment of the present invention, as well as a portion of an X-ray exposure apparatus having the partition. The X-ray window $E_1$ is disposed between an exposure chamber 1 and a beam duct 2. As will be described later, a beam of X-rays $L_1$ such as synchrotron X-rays produced from a light source 3 (FIG. 3) such as a charged particle accumulation ring, for example, passes through the beam duct 2, being kept in a ultra-high vacuum, and it is introduced into the exposure chamber 1 through the X-ray window $E_1$.

The inside of the exposure chamber 1 is controlled to be occupied by a reduced pressure ambience of helium gas, for example, of about 0.2 Pa, for example. This is to prevent attenuation of X-rays and, with convection of helium gas, to facilitate heat radiation from a wafer $W_1$, for example.

The X-ray window $E_1$ includes a beryllium film 11, comprising a thin film of several microns or several tens of microns in thickness, and a flange (supporting means) 12 for supporting the outside peripheral edge of the film. The outside peripheral edge of the beryllium film 11 is fixed to the flange 12 by means of a bonding ring 13. The flange 12 is fixedly mounted to a flange 2a, for example, of the beam duct 2 by means of an O-ring 14 and bolts 15.

As described, the beryllium film 11 should have mechanical strength sufficient sufficient to bear a pressure difference $\Delta P$ between a pressure $P_1$ of the beam duct 2, being kept in a high vacuum, and a pressure $P_2$ of the exposure chamber, being kept in a reduced pressure ambience of helium gas. Additionally, it should have a high X-ray transmissivity. Thus, it is desirable to reduce the thickness of the beryllium film 11 as much as possible, within the limit of the required mechanical strength.

Thus, the thickness $T_1$ of the beryllium film 11 may be determined, from the tension stress $\sigma_1$ to be produced at the central portion of the film 11 as flexure is produced in the film 11 in response to the tolerance value for the pressure difference $\Delta P$, that is, to a design pressure $P_0$, and in accordance with equation (4) having been mentioned.

However, there is a possibility that, even when the central tension stress $\sigma_1$ does not exceed the breaking stress $\sigma_0$, the outside peripheral portion of the beryllium film 11 is broken due to the stress concentration at the contact portion between the beryllium film 11 and the flange 12. In consideration of this, the flange 12 is provided at its inside peripheral edge with a curved portion (curvature support) 12a of a ring-like shape, having a predetermined curvature radius R. This curved portion 12a contacts the outside peripheral edge portion of the beryllium film 11 to bend it along the curved face of the curvature support. This effectively prevents stress concentration and, thus, breakage of the beryllium film 11.

As the outside peripheral portion of the beryllium film is curved along the curvature portion 12a, a tension stress of produced thereby is added to the tension stress $\sigma_2$ to be produced by deflection caused by the pressure difference $\Delta P$ between the exposure chamber 1 and the beam duct 2.

Figure 2:
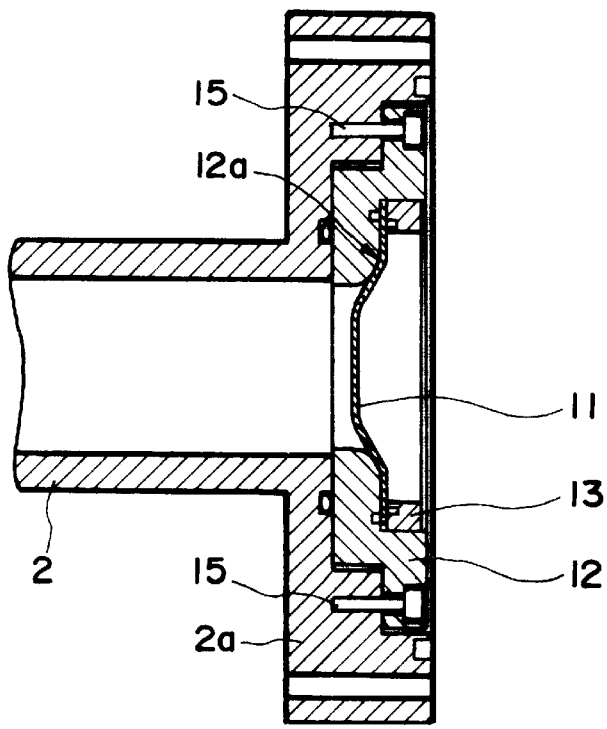
FIG. 2 is a schematic and sectional view for explaining flexure of the X-ray window due to a pressure difference.

Thus, the curvature radius R of the curvature portion 12a of the flange 12 may be determined as follows. When, as shown in FIG. 2, deflection is produced in the beryllium film 11 due to a pressure difference $\Delta P$ and the outside peripheral edge portion of the beryllium film 11 is curved along the curvature portion 12a of the flange 12, the tension stress $\sigma t$ produced at the outside peripheral portion of the film 11 corresponds to the sum of (i) a tension stress $\sigma_2$ produced by deflection resulting from the pressure difference $\Delta P$ and (ii) a tension stress of produced by flexure of the film along the curvature portion 12a of the flange 12. Namely:

$$\sigma t = \sigma_2 + \sigma f \tag{5}$$

The tension stress $\sigma f$ can be calculated from the curvature radius R of the curved portion 12a and the thickness $T_1$ of the beryllium film 11, in accordance with the following equation:

$$\sigma f = 0.5 \cdot E \cdot T_1 / R \tag{6}$$

From equations (6) and (2), it follows that:

$$\sigma t = 0.328 (E \cdot \Delta P^{1/2} \cdot a^{1/2} / T_1^{2})^{1/3} + 0.5 \cdot E \cdot T_1 / R \tag{7}$$

In order to assure that the tension stress $\sigma t$ produced at the outside peripheral portion of the beryllium film 11 is smaller than the tension stress $\sigma_1$ produced at the center of the film 11, on an occasion when the pressure difference $\Delta P$ is equal to the design pressure $P_0$, from equations (7) and (1) it follows that:

$$R > 5.263 \cdot (E^2 \cdot T_1^5 / P_0^2 / a^2)^{1/3} \tag{8}$$

Namely, the curvature radius R of the curvature portion 12a of the flange 12 may well be selected to satisfy equation (8).

Practically, a larger tension stress is produced at a portion slightly inside the outside peripheral edge of the beryllium film, than at the outside peripheral edge, and preferably the curvature radius of the curvature portion 12a of the flange 12 may be gradually enlarged toward the inside edge thereof.

When the outside peripheral portion of the beryllium film 11 is bent along the curvature portion having a curvature radius determined as described above, there is no possibility that a tension stress larger than that at the center of the beryllium film is produced in the outside peripheral portion thereof. Since breakage of the beryllium film can be avoided as the film thickness is designed on the basis of the tension stress at the central portion of the film, there is no necessity of using an unnecessarily enlarged safety factor as in the conventional example. Thus, the required beryllium film thickness can be reduced and the X-ray transmissivity of the film can be improved significantly.

Figure 3:
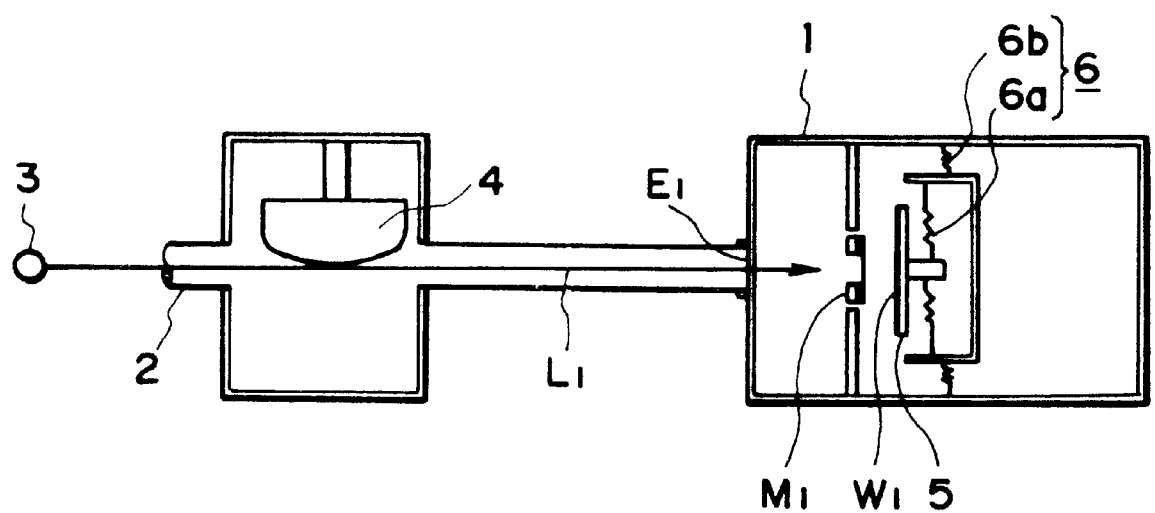
FIG. 3 is a schematic view of a general structure of an X-ray exposure apparatus.

FIG. 3 shows a general structure of an X-ray exposure apparatus. Light source 3 projects a beam of X-rays $L_1$, comprising sheet-beam-like synchrotron radiation, and it is expanded by a convex mirror 4 in a direction perpendicular to the orbital plane of the radiation light. The X-ray beam $L_1$ being reflectively expanded by the convex mirror 4 passes through the X-ray window $E_1$, and it is introduced into the exposure chamber 1. Then, by means of a shutter (not shown), the X-ray beam is adjusted to provide a uniform exposure amount within an exposure region. The X-ray beam $L_1$ passing the unshown shutter is projected to a mask $M_1$. A wafer (substrate) $W_1$ is held vertically by a wafer chuck (substrate holding means) 5. An exposure pattern formed on the mask $M_1$ is transferred, by exposure, onto the wafer $W_1$ in accordance with a step-and-repeat procedure, for example. The wafer chuck 5 can be positioned precisely with respect to five directions, by means of a wafer stage 6, which comprises a fine-motion stage 6a and a rough-motion stage 6b.

Next, an embodiment of a semiconductor device manufacturing method which uses an X-ray exposure apparatus such as described above, will be explained.

Figure 4:
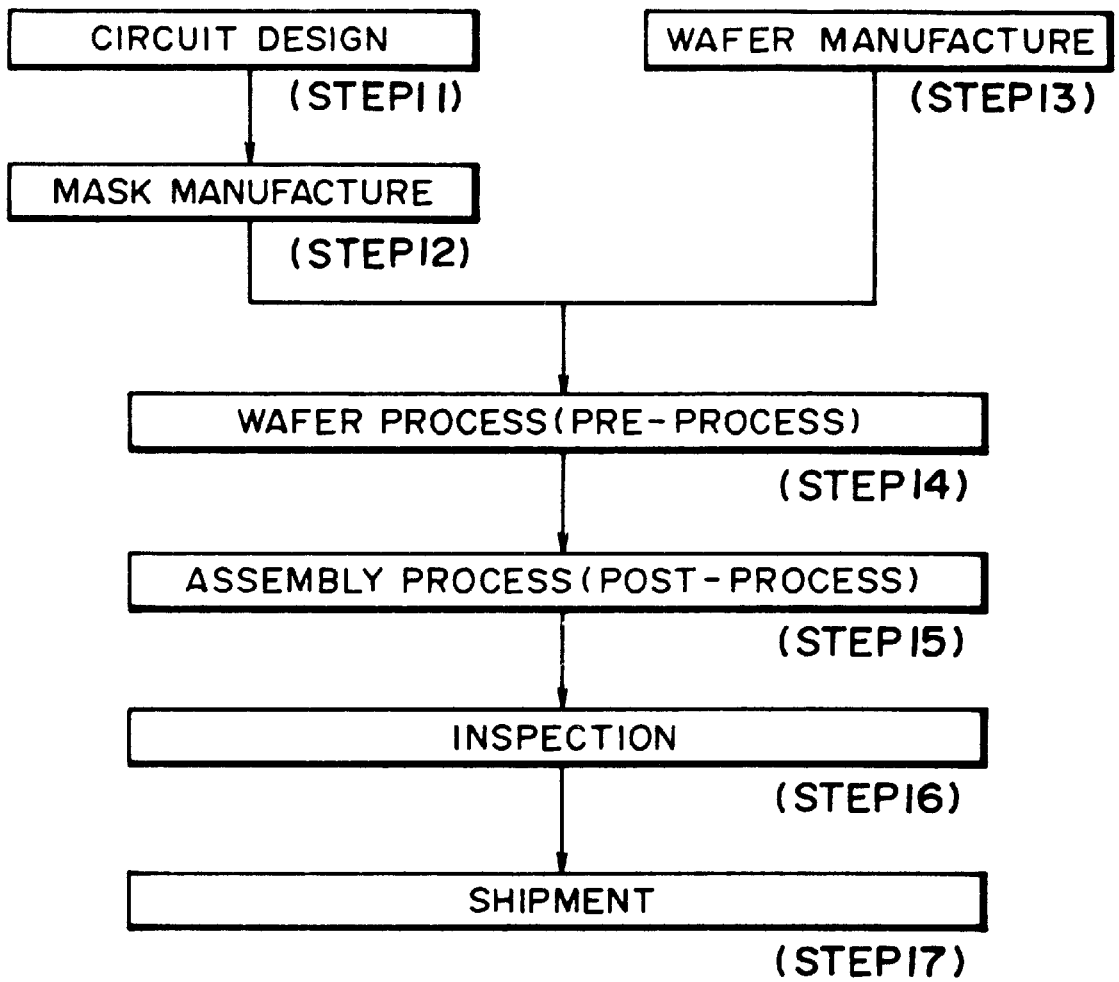
FIG. 4 is a flow chart of semiconductor device manufacturing processes.

FIG. 4 is a flow chart of a procedure for the manufacture of semiconductor devices such as semiconductor chips (e.g., ICs or LSIs), liquid crystal panels, CCDs, thin film magnetic heads or micro-machines, for example. Step S11 is a design process for designing a circuit of a semiconductor device. Step S12 is a process for making a mask on the basis of the circuit pattern design. Step S13 is a process for preparing a wafer by using a material such as silicon. Step S14 is a wafer process which is called a pre-process wherein, by using the so prepared mask and wafer, circuits are practically formed on the wafer through lithography. Step S15 subsequent to this is an assembling step which is called a post-process wherein the wafer having been processed by step S14 is formed into semiconductor chips. This step includes an assembling (dicing and bonding) process and a packaging (chip sealing) process. Step S16 is an inspection step wherein an operation check, a durability check and so on for the semiconductor devices provided by step S15, are carried out. With these processes, semiconductor devices are completed and they are shipped (step S17).

Figure 5:
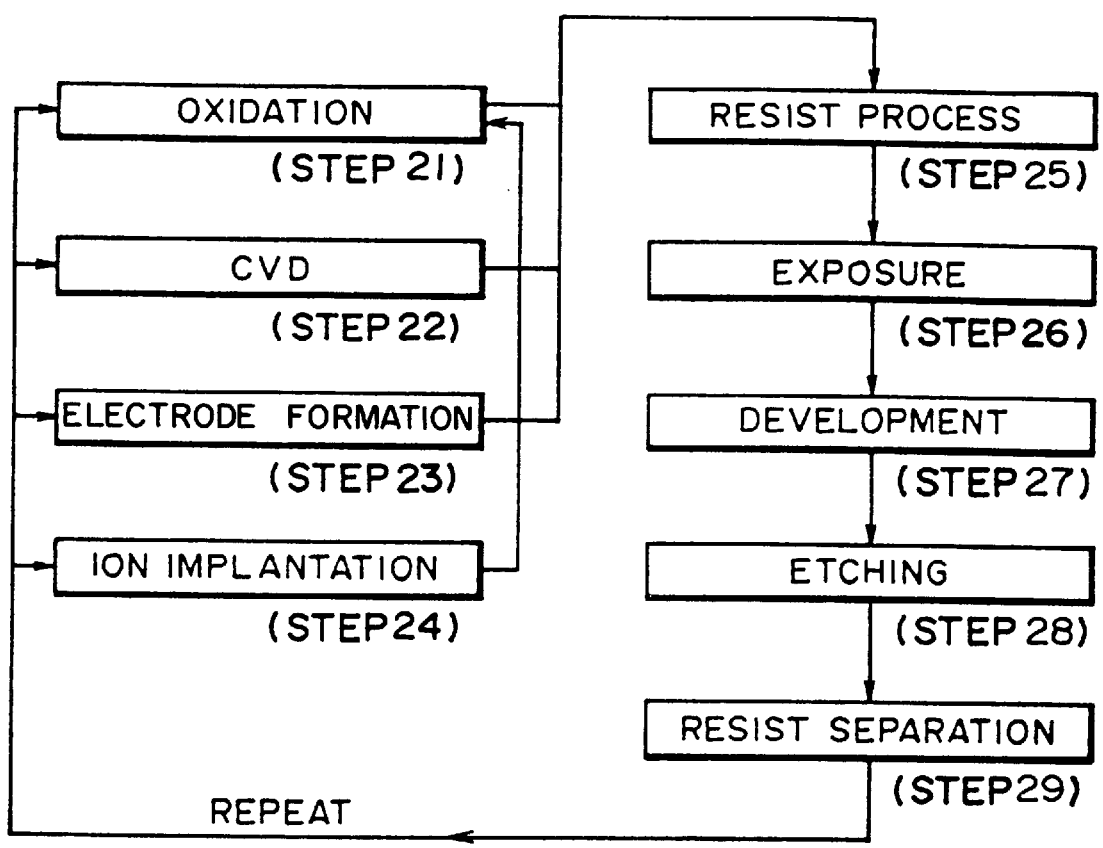
FIG. 5 is a flow chart of a wafer process.
Figure 6:
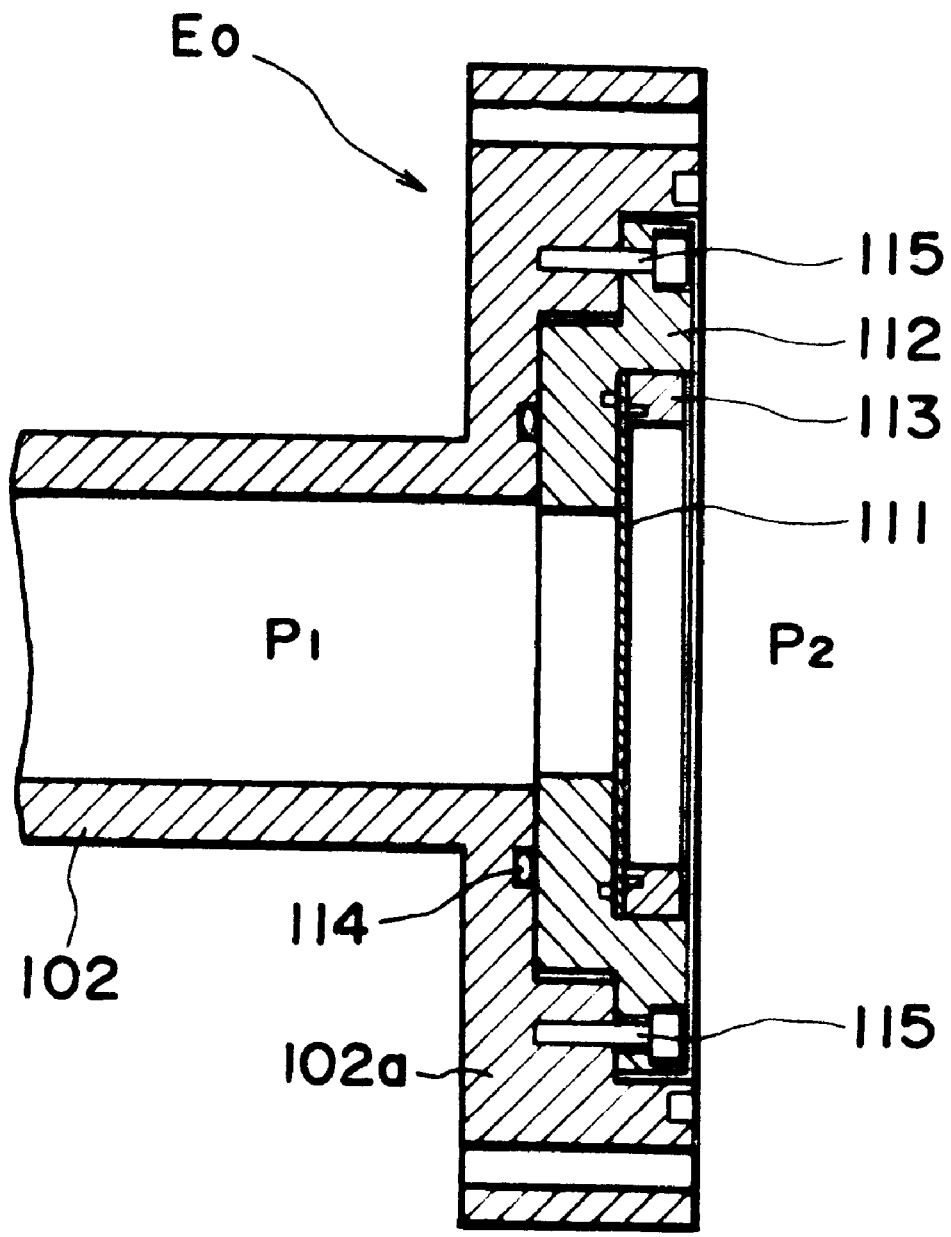
FIG. 6 is a schematic and sectional view of a known example of a partition wall.

FIG. 5 is a flow chart showing details of the wafer process. Step S21 is an oxidation process for oxidizing the surface of a wafer. Step S22 is a CVD process for forming an insulating film on the wafer surface. Step S23 is an electrode forming process for forming electrodes upon the wafer by vapor deposition. Step S24 is an ion implanting process for implanting ions to the wafer. Step S25 is a resist process for applying a resist (photosensitive material) to the wafer. Step S26 is an exposure process for printing, by exposure, the circuit pattern of the mask on the wafer through the exposure apparatus described above. Step S27 is a developing process for developing the exposed wafer. Step S28 is an etching process for removing portions other than the developed resist image. Step S29 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A pressure partition, comprising:
   a thin film for dividing a predetermined space into two spatial zones; and
   supporting means for supporting said film at an outside peripheral portion thereof, said supporting means having a curved surface for producing curvature in the outside peripheral portion of said film, wherein said curved surface is disposed at one of the two spatial zones having a lower pressure as compared with the other, and said curved surface has a convex shape with respect to a plane intersecting said film.

2. A pressure partition according to claim 1, wherein said curved surface has a curvature radius which is larger than the value of the curvature radius to be defined when a tension stress $\sigma f$ to be produced at the outside peripheral portion of said film by flexure thereof along said curved surface becomes equal to a difference between tension stresses $\sigma_1$ and $\sigma_2$, to be produced at the center portion and the outside peripheral portion of the film, respectively, by deflection of the film due to a pressure difference between the two spatial zones.

3. A pressure partition according to claim 1, wherein said curved surface has a curvature radius which increases toward the center of said film.

4. An exposure method, comprising the steps of:
   dividing a predetermined space into two spatial zones by use of a thin film;
   supporting an outside peripheral portion of the film so that, due to a pressure difference between the two spatial zones, the film is deformed to follow a curved surface portion of a support; and
   exposing a substrate with X-rays passed through the film.

5. A device manufacturing method, comprising the steps of:
   dividing a predetermined space into two spatial zones by use of a thin film;
   supporting an outside peripheral portion of the film so that, due to a pressure difference between the two spatial zones, the film is deformed to follow a curved surface portion of a support;
   exposing a substrate with X-rays passed through the film; and
   developing the exposed substrate.

6. A pressure partition, comprising:
   a thin film for dividing a predetermined space into two spatial zones; and supporting means for supporting said film at an outside peripheral portion thereof, said supporting means having a curved surface for producing curvature in the outside peripheral portion of said film, along a predetermined curvature plane, wherein said curved surface has a curvature radius which increases toward the center of said film.

7. An X-ray exposure apparatus, comprising:

a pressure partition comprising (i) a thin film for dividing a predetermined space into two spatial zones, and (ii) supporting means for supporting said film at an outside peripheral portion thereof, said supporting means having a curved surface for producing curvature in the outside peripheral portion of said film, along a predetermined curvature plane, wherein said curved surface has a curvature radius which increases toward the center of said film; and substrate holding means for holding a substrate to be exposed with X-rays being extracted through said pressure partition.

8. An X-ray exposure apparatus according to claim 7, wherein said curved surface has a curvature radius which is larger than the value of the curvature radius to be defined when a tension stress σf to be produced at the outside peripheral portion of said film by flexure thereof along said curved surface becomes equal to a difference between tension stresses $\sigma_1$ and $\sigma_2$, to be produced at the center portion and the outside peripheral portion of the film, respectively, by deflection of the film due to a pressure difference between the two spatial zones.

9. A device manufacturing method comprising:

providing a pressure partition that includes (i) a thin film for dividing a predetermined space into two spatial zones, and (ii) supporting means for supporting the film at an outside peripheral portion thereof, the supporting means having a curved surface for producing curvature in the outside peripheral portion of the film, along a predetermined curvature plane, wherein the curved surface has a curvature radius which increases toward the center of the film;

holding a substrate to be exposed with X-rays being extracted through the pressure partition; and transferring a pattern onto a substrate to manufacture a device.

10. A device manufacturing method according to claim 9, wherein the curved surface has a curvature radius which is larger than the value of the curvature radius to be defined when a tension stress σf to be produced at the outside peripheral portion of the film by flexure thereof along the curved surface becomes equal to a difference between tension stresses $\sigma_1$ and $\sigma_2$, to be produced at the center portion and the outside peripheral portion of the film, respectively, by deflection of the film due to a pressure difference between the two spatial zones.

11. A partitioning method, comprising the steps of:

dividing a predetermined space into two spatial zones by use of a thin film; and supporting an outside peripheral portion of the film so that, due to a pressure difference between the two spatial zones, the film is deformed to follow a curved surface portion of a support.

12. A method according to claim 11, wherein the curved surface portion of the support has a convex shape with respect to a plane intersecting the film.

13. A method according to claim 11, wherein the curved surface has a curvature radius which is larger than the value of the curvature radius to be defined when a tension stress σf to be produced at the outside peripheral portion of the film by flexure thereof along the curved surface becomes equal to a difference between tension stresses $\sigma_1$ and $\sigma_2$, to be produced at the center portion and the outside peripheral portion of the film, respectively, by deflection of the film due to a pressure difference between the two spatial zones.

14. A method according to claim 11, wherein the curved surface has a curvature radius which increases toward the center of the film.

* * * * *

UNITED STATES PATENT AND TRADEMARK OFFICE
CERTIFICATE OF CORRECTION

PATENT NO. : 6,097,790
DATED : August 1, 2000
INVENTOR(S) : TAKAYUKI HASEGAWA, ET AL.

It is certified that error appears in the above-identified patent and that said Letters Patent is hereby corrected as shown below:

COLUMN 3:
  Line 13, "riot" should read --not--.

COLUMN 4:
  Line 7, "AP" should read --ΔP--.

Signed and Sealed this

Fifteenth Day of May, 2001

Attest:

NICHOLAS P. GODICI

Attesting Officer     Acting Director of the United States Patent and Trademark Office